US008614469B2

(12) United States Patent  
Iwasaki et al.

(10) Patent No.: US 8,614,469 B2  
(45) Date of Patent: Dec. 24, 2013

(54) SEMICONDUCTOR DEVICE AND MANUFACTURING METHOD OF THE SAME

(75) Inventors: Toshifumi Iwasaki, Tokyo (JP); Yoshihiko Kusakabe, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/605,995

(22) Filed: Sep. 6, 2012

(65) Prior Publication Data

US 2012/0326246 A1 Dec. 27, 2012

Related U.S. Application Data

(63) Continuation of application No. 13/155,279, filed on Jun. 7, 2011, now Pat. No. 8,294,186, which is a continuation of application No. 12/250,526, filed on Oct. 13, 2008, now abandoned.

(30) Foreign Application Priority Data

Nov. 21, 2007 (JP) ................. 2007-301208

(51) Int. Cl.  
*H01L 29/76* (2006.01)

(52) U.S. Cl.  
USPC ............ 257/288; 257/E21.205; 257/E21.676; 257/E21.64; 257/E21.626

(58) Field of Classification Search  
None  
See application file for complete search history.

(56) References Cited

U.S. PATENT DOCUMENTS

| | | | |
|---|---|---|---|
| 7,265,425 B2 | 9/2007 | Chen et al. | |
| 7,696,050 B2 | 4/2010 | Yamaguchi et al. | |
| 7,737,510 B2 | 6/2010 | Akamatsu | |
| 2007/0034963 A1 | 2/2007 | Sudo | |
| 2007/0122966 A1 | 5/2007 | Hoentschel et al. | |
| 2007/0267678 A1* | 11/2007 | Lo | 257/314 |

FOREIGN PATENT DOCUMENTS

| | | |
|---|---|---|
| JP | 2006-148077 A | 6/2006 |
| JP | 2006-173432 A | 6/2006 |
| JP | 2007-049166 A | 2/2007 |
| JP | 2007-103642 A | 4/2007 |
| JP | 2007-123518 A | 5/2007 |

OTHER PUBLICATIONS

Japanese Office Action issued Nov. 6, 2012, in Japanese Application No. 2007-301208.

\* cited by examiner

*Primary Examiner* — Michael Lebentritt  
*Assistant Examiner* — Aaron Dehne  
(74) *Attorney, Agent, or Firm* — Miles & Stockbridge P.C.

(57) ABSTRACT

A semiconductor device capable of improving the driving power and a manufacturing method therefor are provided. In a semiconductor device, a gate structure formed by successively stacking a gate oxide film and a silicon layer is arranged over a semiconductor substrate. An oxide film is arranged long the lateral side of the gate structure and another oxide film is arranged along the lateral side of the oxide film and the upper surface of the substrate. In the side wall oxide film comprising these oxide films, the minimum value of the thickness of the first layer along the lateral side of the gate structure is less than the thickness of the second layer along the upper surface of the substrate.

2 Claims, 12 Drawing Sheets

SEMICONDUCTOR DEVICE AND MANUFACTURING METHOD OF THE SAME

CROSS-REFERENCE TO RELATED APPLICATIONS

This application is a continuation of application Ser. No. 13/155,279 filed Jun. 7, 2011 now U.S. Pat. No. 8,294,186, which is a continuation of application Ser. No. 12/250,526 filed Oct. 13, 2008 (now abandoned). The disclosure of Japanese Patent Application No. 2007-301208 filed on Nov. 21, 2007 including the specification, drawings and abstract is incorporated herein by reference in its entirety.

BACKGROUND OF THE INVENTION

The present invention concerns a semiconductor device and a manufacturing method of the same and it particularly relates to a technique of enhancing the driving performance by a stress liner film.

In a semiconductor device having a PMOSFET or an NMOSFET, a structure of providing a stress liner film so as to cover a gate electrode has been adopted so far. By providing the stress liner film so as to exert a compressive stress to a channel region in the PMOSFET and exert a tensile stress to a channel region in the NMOSFET, the driving performance in the PMOSFET or the NMOSFET can be enhanced. The stress liner film is formed so as to cover the gate electrode and the side walls after forming side walls on both lateral sides of a gate electrode.

Such semiconductor devices are disclosed, for example, in Japanese Unexamined Patent Publications Nos. 2006-148077, 2006-173432, and 2007-49166.

SUMMARY OF THE INVENTION

In the structure of the semiconductor devices of the patent publications described above, since the stress by the stress liner film is not always applied sufficiently to the channel region by way of the side wall, they involve a problem that the driving performance cannot always be enhanced sufficiently.

The present invention has been achieved for solving the foregoing problem and it intends to provide a semiconductor device capable of enhancing the driving performance and a method of manufacturing the same.

In a semiconductor device according to one aspect of the present invention, a gate structure having a gate oxide film and a polysilicon layer stacked successively over a substrate is arranged. A first oxide film is arranged along the lateral side of the gate structure and a second oxide film is arranged along the lateral side of the first oxide film and the upper surface of the substrate. In the side wall oxide film comprising the first oxide film and the second oxide film, the minimum value of the thickness of the first layer along the lateral side of the gate structure is less than the thickness of the second layer along the upper surface of the substrate.

According to the invention, a distance between the liner nitride film and a channel region can be decreased and the stress by the liner nitride film can be applied sufficiently to a channel region. Accordingly, the driving performance can be enhanced.

DESCRIPTION OF THE ACCOMPANYING DRAWINGS

PREFERRED EMBODIMENTS OF THE INVENTION (Basic Technique)

Figure 1:
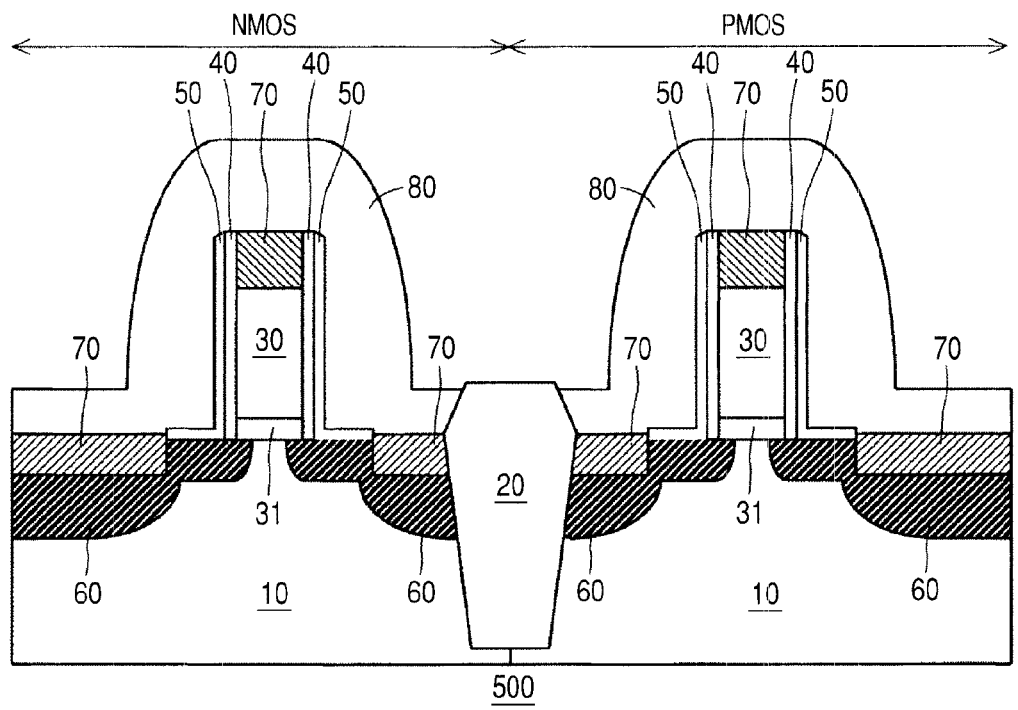
FIG. 1 is a cross sectional view showing the structure of a semiconductor device according to a basic technique.

FIG. 1 is a cross sectional view showing a structure of a semiconductor device 500 according to a basic technique. The semiconductor device 500 according to the basic technique includes a plurality of PMOSFETs or NMOSFETs, which are isolated into a plurality of regions by isolation films 20 arranged in a substrate 10 (semiconductor substrate) comprising Si.

As shown in FIG. 1, in the semiconductor device 500, a gate structure formed by successively stacking a gate oxide film 31 and a polysilicon layer 30 is arranged over the substrate 10. A side wall having an oxide film 40 comprising TEOS (first oxide film) and an oxide film 50 comprising USG (second oxide film) is arranged on both lateral sides of the gate structure. That is, the oxide film 40 is arranged along the lateral side of the gate structure, and the oxide film 50 is arranged along the lateral side of the oxide film 40 and the upper surface of the substrate 10. As to be described later, the semiconductor device 500 has a DSW (disposable Side Wall) structure in which a distance between a liner nitride film 80 and a channel region is decreased by etching to remove a nitride film (90) formed along the oxide film 50 in order to form a source/drain region 60 in the substrate 10 after forming a source/drain region 60. The oxide films 40, 50 are to be described hereinafter collectively also as a side wall oxide film. The side wall oxide film has an L-shaped cross section and has a first layer along the lateral side of the gate structure and a second layer along the upper surface of the substrate 10.

Further, in the substrate 10, the source/drain region 60 is arranged with a channel region just below the gate structure being put therebetween.

Further, a silicide layer 70 is arranged over the gate structure and the substrate 10. The silicide layer 70 is not arranged to all of MOSFETs over one identical substrate 10 but is arranged only to predetermined MOSFETs in which lowering of resistance is required (in the present specification, only the MOSFET provided with the silicide layer 70 is shown).

Further, a liner nitride film 80 (stress liner film) is arranged over the entire surface so as to cover the gate structure and the side wall.

FIG. 2 to FIG. 7 are cross sectional views showing a method of manufacturing the semiconductor device 500 in FIG. 1.

Figure 2:
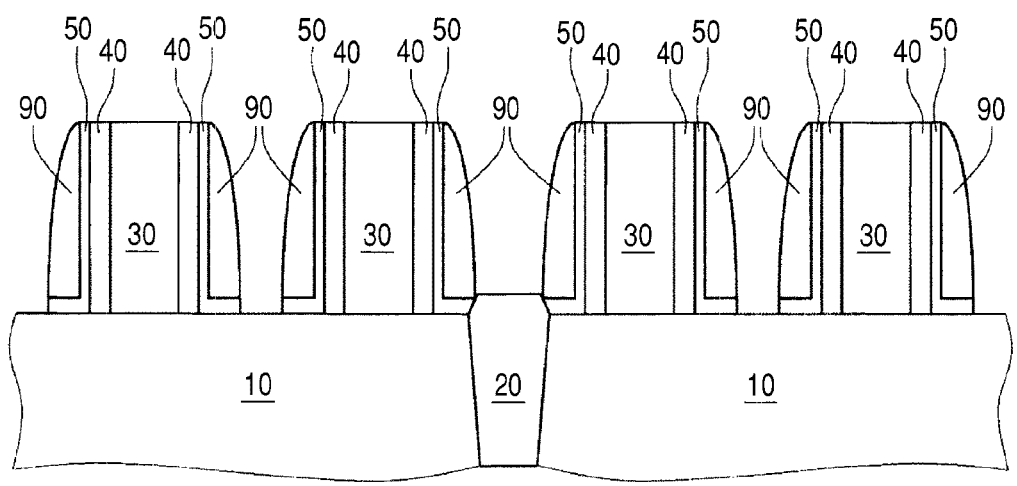
FIG. 2 is a cross sectional view showing the manufacturing method of the semiconductor device according to a basic technique.

At first, as shown in FIG. 2, an isolation film 20 is formed in the substrate 10. Then, a gate structure is formed according to a predetermined gate pattern over a substrate 10 (only the polysilicon layer 30 is shown while saving the gate oxide film 31 for the convenience of illustration). Then, an oxide film 40 is formed along the lateral surface of the gate structure. Then, an oxide film 50 along the lateral side of the oxide film 40 and the upper surface of the substrate 10, and a nitride film 90 along the oxide film 50 are formed. Then, a source/drain region 60 is formed in the substrate 10 by implanting impurities from above and activating them by annealing (in FIG. 2 to FIG. 7, the source/drain region 60 is not illustrated for the convenience of illustration).

Figure 3:
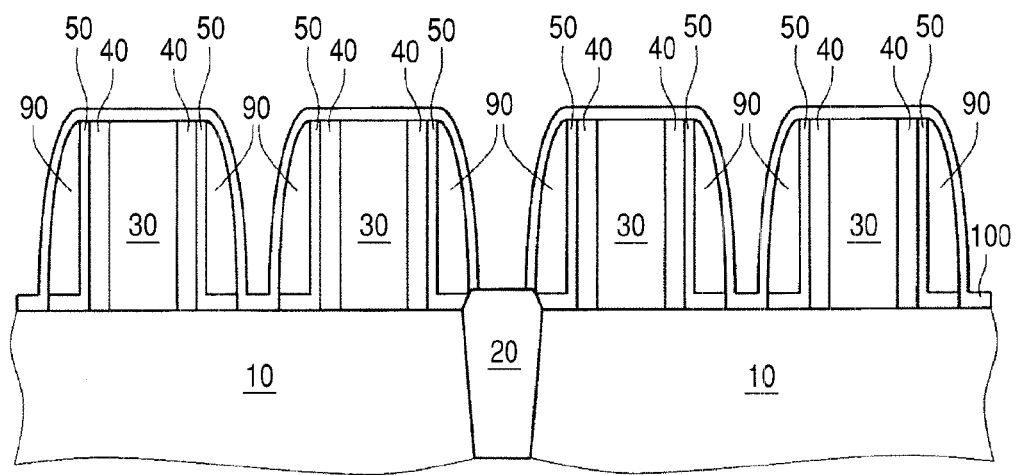
FIG. 3 is a cross sectional view showing the manufacturing method of the semiconductor device according to a basic technique.

Then, as shown in FIG. 3, an oxide film 100 comprising USG is formed by deposition over the entire surface. The oxide film 100 functions as a silicide protection film for protecting an MOSFET which is not to be formed with the silicide layer 70 from silicidation in the subsequent siliciding step, and it is removed from the MOSFET which is to be formed with the silicide layer 70, before the siliciding step.

Figure 4:
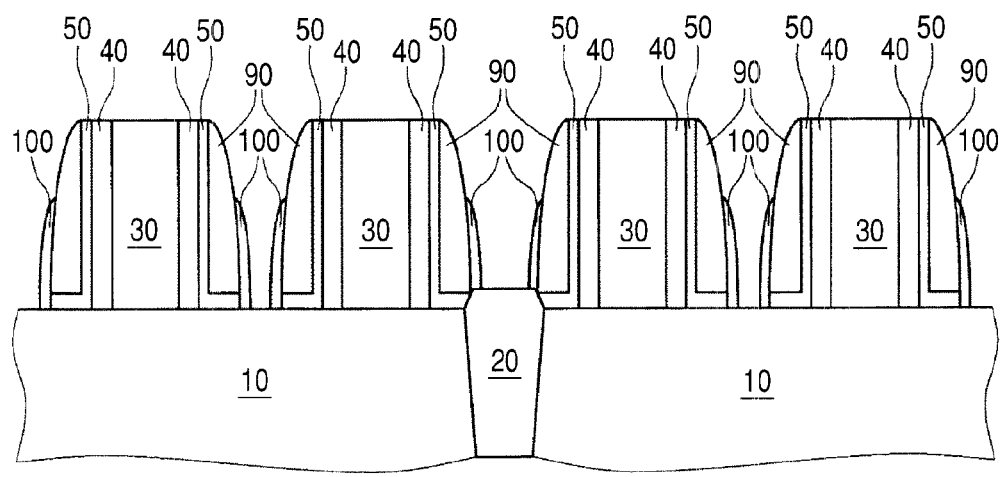
FIG. 4 is a cross sectional view showing the manufacturing method of the semiconductor device according to a basic technique.

Then, as shown in FIG. 4, the oxide film 100 is left only to the outside of the side wall by applying wet etching.

Figure 5:
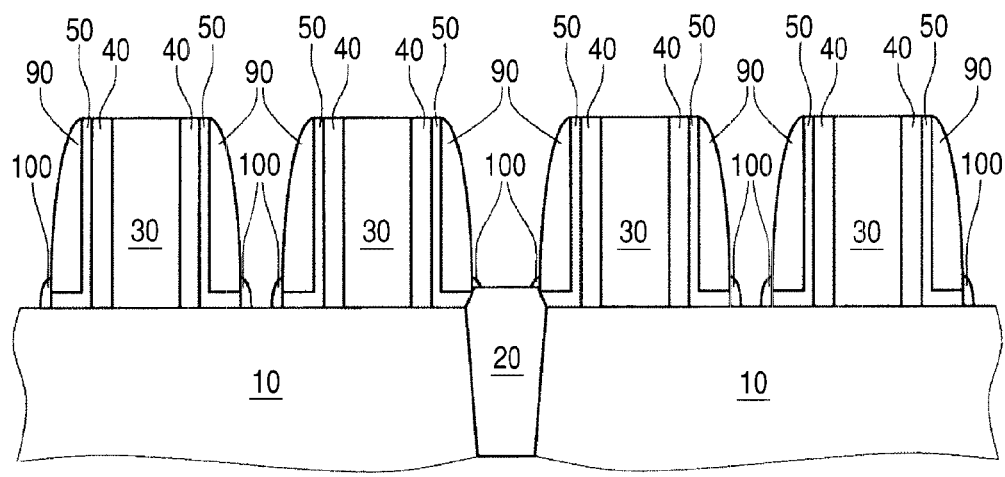
FIG. 5 is a cross sectional view showing the manufacturing method of the semiconductor device according to a basic technique.

Then, as shown in FIG. 5, the oxide film 100 left to the outside of the side wall is further decreased by applying etching (petit side wall).

Figure 6:
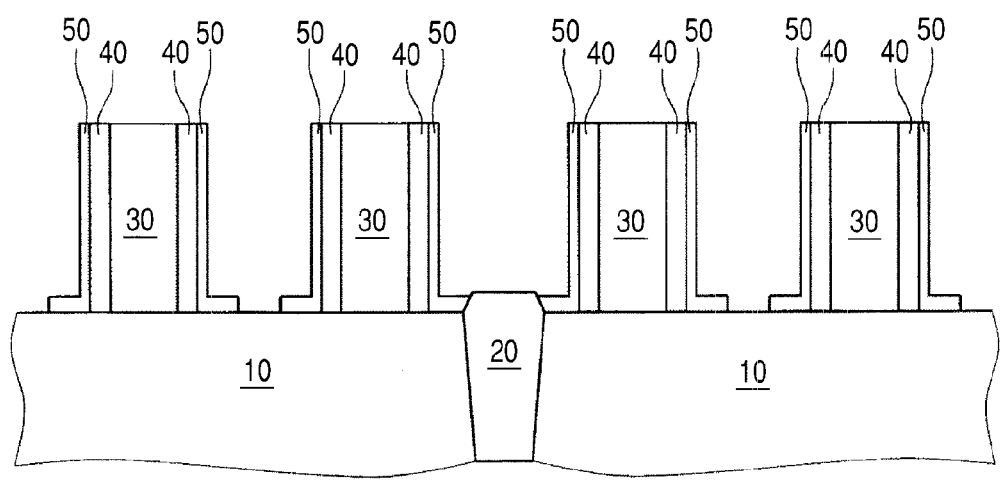
FIG. 6 is a cross sectional view showing the manufacturing method of the semiconductor device according to a basic technique.

Then, as shown in FIG. 6, the petit side wall is removed by applying etching. Then, the nitride film 90 is removed by applying etching. In this case, the polysilicon layer 30 and the substrate 10 can be protected against etching by previously forming an oxide film to the Si surface of the polysilicon layer 30 and the substrate 10 by $O_2$ ashing or the like before the etching.

Figure 7:
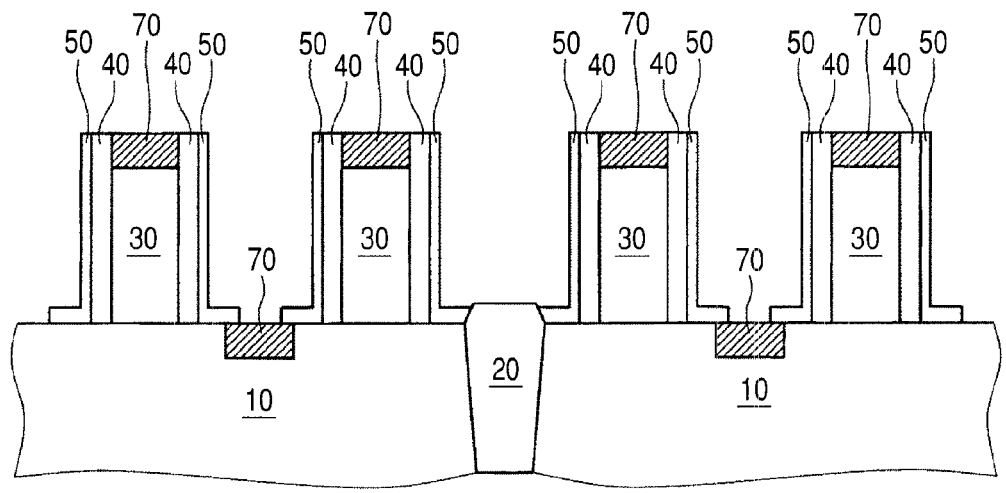
FIG. 7 is a cross sectional view showing the manufacturing method of the semiconductor device according to a basic technique.

Then, as shown in FIG. 7, a silicide layer 70 comprising NiSi is formed over the gate structure and the substrate 10. Specifically, after depositing Ni over the entire surface, it is silicided by annealing and unreacted Ni is removed. Then, a liner nitride film 80 is deposited so as to cover the gate structure and the side wall, whereby the semiconductor device 500 shown in FIG. 1 is manufactured.

As shown in FIG. 1, in the semiconductor device 500 according to the basic technique, the thickness of the first layer along the lateral side of the gate structure is greater than the thickness of the second layer along the upper surface of the substrate 10 in the side wall oxide film comprising the oxide films 40, 50. Accordingly, this involves a problem that the stress by the liner nitride film 80 cannot always be applied sufficiently to the channel region.

First Embodiment

Figure 8:
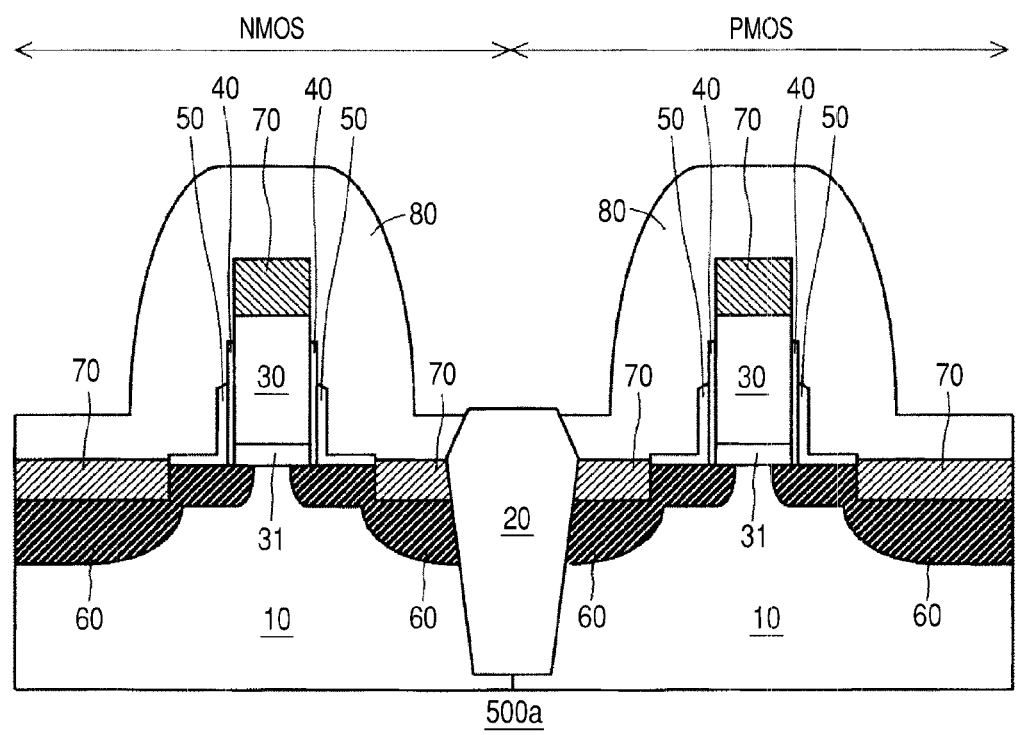
FIG. 8 is a cross sectional view shown an example of a structure of the semiconductor device according to a first embodiment.

FIG. 8 is a cross sectional view showing the structure of a semiconductor device 500a according to a first embodiment. In this embodiment shown in FIG. 8, the thickness of the first layer along the lateral side of the gate structure is decreased to less than the thickness of the second layer along the upper surface of the substrate 10 in the basic technique shown in FIG. 1. That is, in the side wall shown in FIG. 8, the thickness of the first layer is decreased upward and the minimum value thereof is smaller than the thickness of the second layer. In such a structure, the distance between the liner nitride film 80 and the channel region can be decreased and the stress by the liner nitride film 80 can be applied sufficiently to the channel region.

Figure 9:
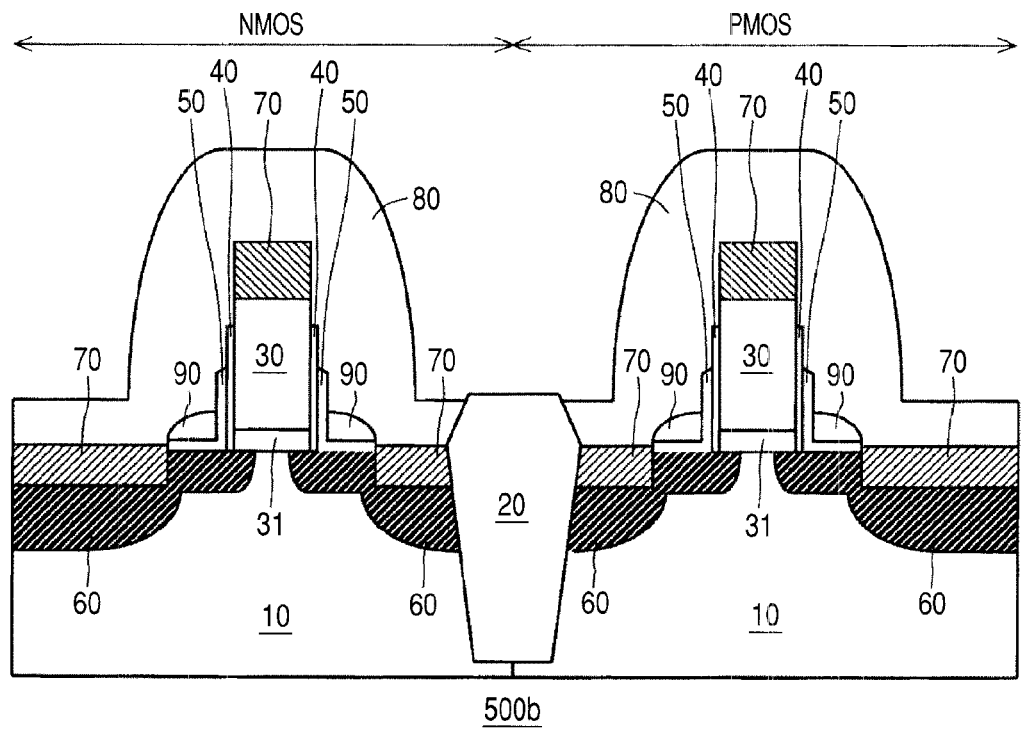
FIG. 9 is a cross sectional view shown another example of a structure of the semiconductor device according to a first embodiment.

FIG. 9 is a cross sectional view showing a structure of a semiconductor device 500b according to the first embodiment. In FIG. 9, the nitride film 90 shown in FIG. 8 is not removed entirely but left partially on the oxide film 50. As shown in FIG. 9, even when a portion of the nitride film 90 is left, the stress by the liner nitride film 80 can be applied sufficiently to the channel region unless the region of the first layer that takes a minimum value is covered with the nitride film 90. The nitride film 90 has a rectangular parallelepiped shape in which each of the bottoms is preferably smaller than the height and the height is preferably 10 nm or less.

FIG. 10 to FIG. 20 are cross sectional views showing a method of manufacturing the semiconductor device 500a in FIG. 9.

Figure 10:
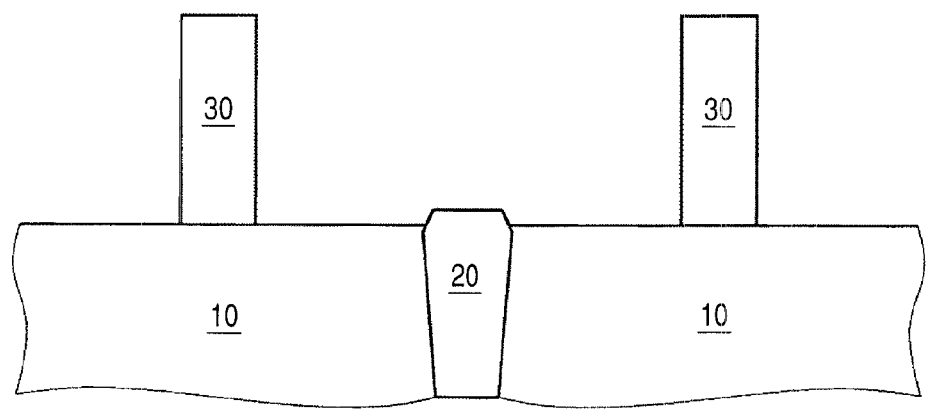
FIG. 10 is a cross sectional view showing a manufacturing method of the semiconductor device according to a first embodiment.

At first, as shown in FIG. 10, an isolation film 20 is formed in a substrate 10. Then, a gate structure is formed over the substrate 10 according to a predetermined gate pattern (only the polysilicon layer 30 is shown while saving the gate oxide film 31 for the convenience of illustration).

Figure 11:
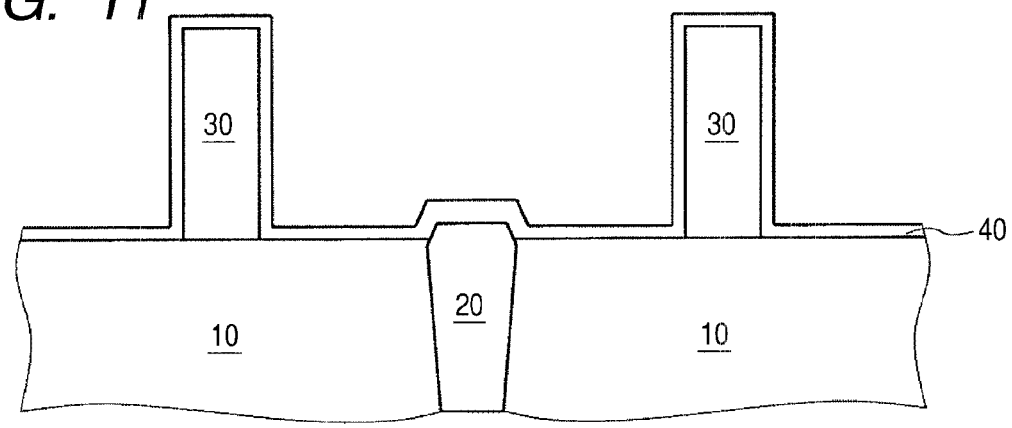
FIG. 11 is a cross sectional view showing a manufacturing method of the semiconductor device according to a first embodiment.

Then, as shown in FIG. 11, an oxide film 40 comprising TEOS is formed over the entire surface by depositing to 6 nm at 620° C. Then, bake-hardening is applied at 900° C. HTO may be deposited at 750° C. instead of TEOS and bake-hardening is not necessary in this case.

Figure 12:
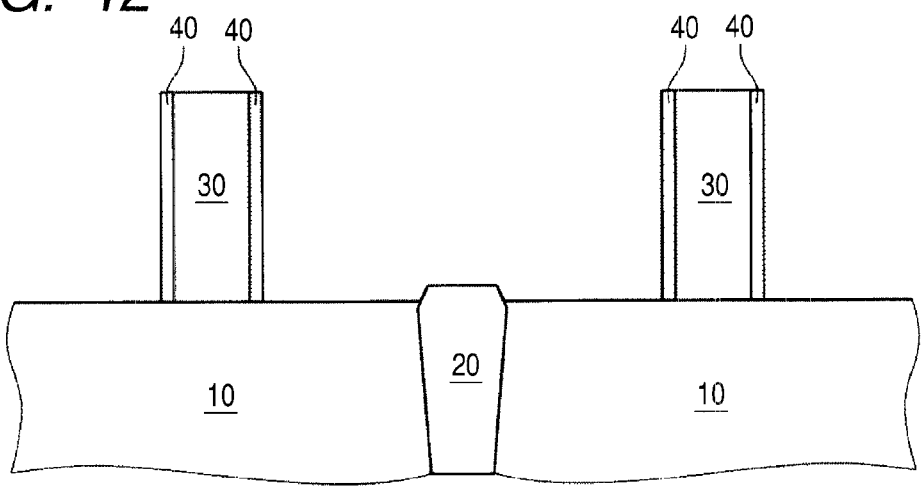
FIG. 12 is a cross sectional view showing a manufacturing method of the semiconductor device according to a first embodiment.

Then, as shown in FIG. 12, the oxide film 40 is left only on the lateral side of the gate structure by applying anisotropic etching.

Figure 13:
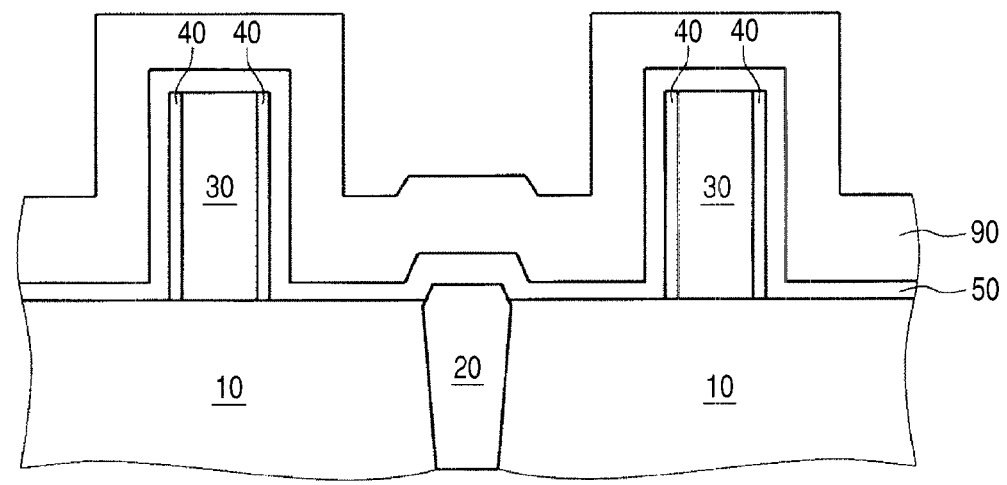
FIG. 13 is a cross sectional view showing a manufacturing method of the semiconductor device according to a first embodiment.

Then, as shown in FIG. 13, an oxide film 50 comprising USG is formed over the entire surface by deposition to 10 nm at 480° C. Then, a nitride film 90 comprising ALD-SiN is formed over the entire surface by deposition to 30 nm at 500° C. Instead of ALD-SiN, HCD-SiN may be deposited at 600° C.

Figure 14:
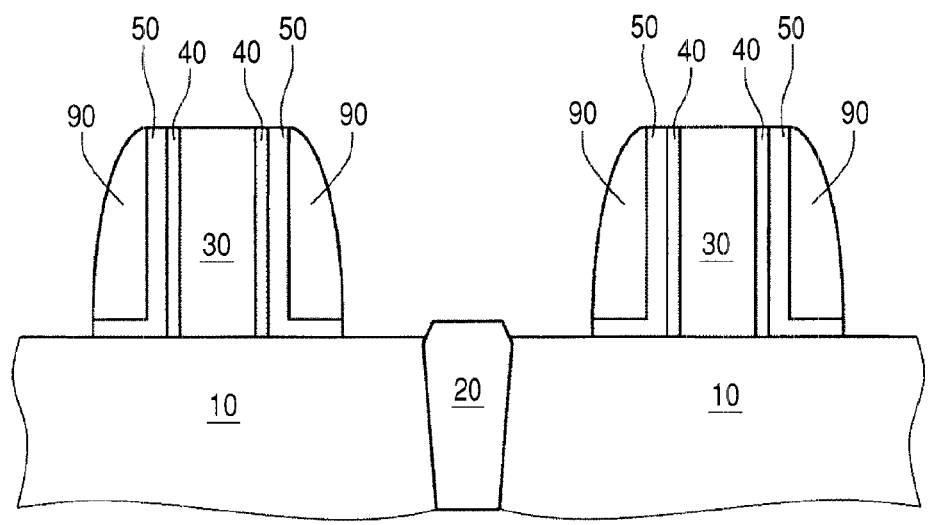
FIG. 14 is a cross sectional view showing a manufacturing method of the semiconductor device according to a first embodiment.

Then, as shown in FIG. 14, by applying etching back, the oxide film 50 is fabricated into an L-cross sectional shape and the nitride film 90 is left only over the second layer of the side wall oxide film. Then, by implanting impurities from above and activating by annealing, a source/drain region 60 is formed in the substrate 10 (source/drain region 60 is not shown in FIG. 14 to FIG. 20 for the sake of illustration).

Figure 15:
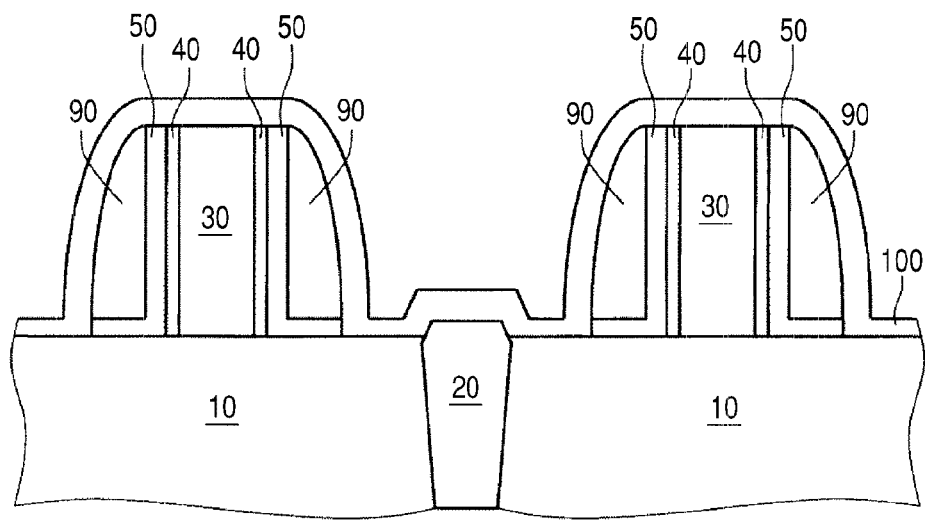
FIG. 15 is a cross sectional view showing a manufacturing method of the semiconductor device according to a first embodiment.

Then, as shown in FIG. 15, an oxide film 100 comprising USG is formed over the entire surface to 20 nm by deposition at 480° C.

Figure 16:
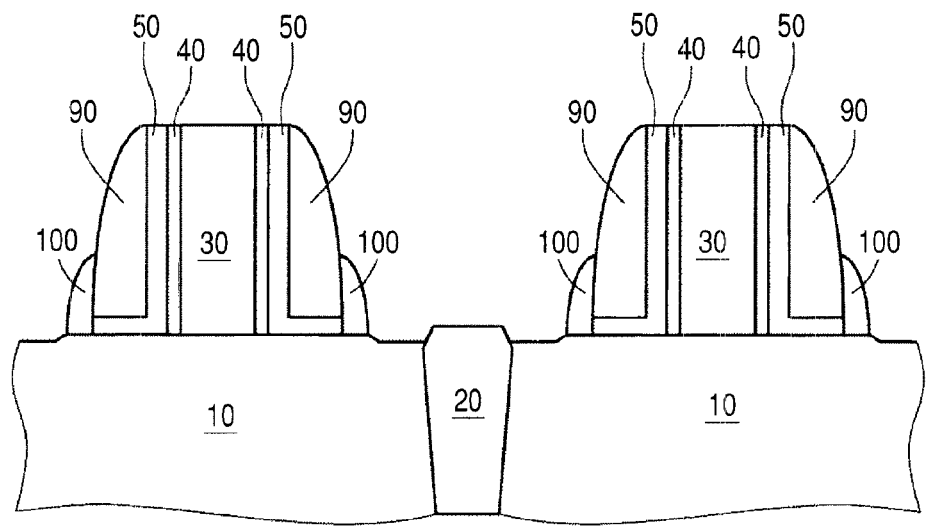
FIG. 16 is a cross sectional view showing a manufacturing method of the semiconductor device according to a first embodiment.

Then, as shown in FIG. 16, the oxide film 100 is left only to the outside of the side wall by applying etching. In this case, not only the oxide film 100 but also the substrate 10 are engraved downward by etching at the outside of the side wall.

Generally, when the substrate 10 is engraved downward, while the possibility of increasing the leak current is increased, this is minimized in FIG. 16 since the second layer of the oxide film 50 protects the substrate 10 near the gate structure. That is, while it is preferred that the first layer of the side wall is thin in order to enhance the driving performance, it is preferred that the second layer of the side wall is thick (to such an extent not eliminated by etching) in order to prevent increase of the leak current.

Figure 17:
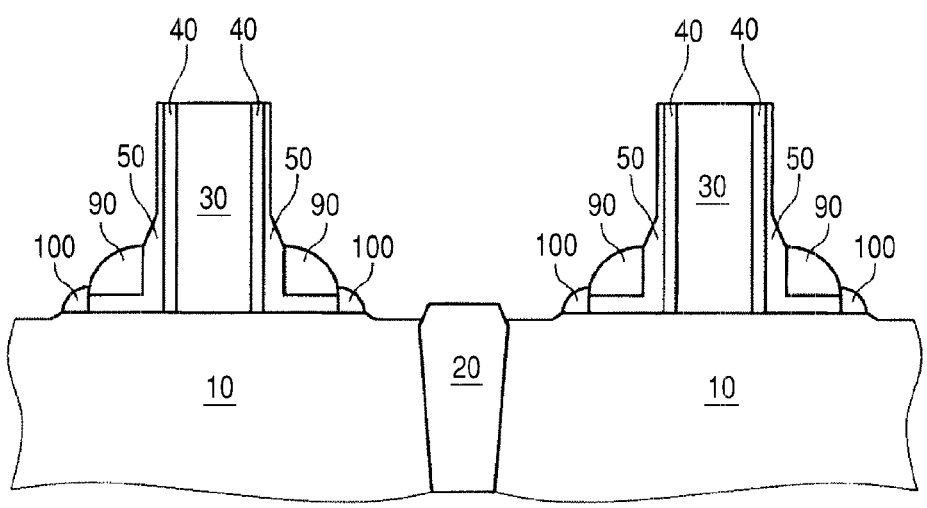
FIG. 17 is a cross sectional view showing a manufacturing method of the semiconductor device according to a first embodiment.

Then, as shown in FIG. 17, the oxide film 100 left to the outside of the side wall is further decreased (petit side wall) by applying wet etching. In this case, by applying wet etching using hot phosphoric acid at 160° C. for 5 min, the oxide film 50 comprising USG and the nitride film 90 comprising ALD-SiN can be removed more compared with the oxide film 40 comprising TEOS. This enables to decrease the minimum value of the thickness of the first layer along the lateral side of the gate structure to less than the thickness of the second layer along the upper surface of the substrate 10, in the side wall oxide film comprising the oxide films 40, 50.

That is, the first layer can be etched greatly without etching the second layer not so much in the side wall oxide film by using hot phosphoric acid having selectivity greatly different between the oxide film 40 (TEOS) and the oxide film 50 (USG) as the etching solution. The etching rate is defined as: oxide film 40 (TEOS)<oxide film 50 (USG)<<nitride film 90 (ALD-SiN) and the rate for the nitride film is particularly higher relative to that for the oxide film.

The oxide film 40 may be left thinly at the upper end portion of the side wall oxide film as shown in FIG. 17, or it may be removed entirely as shown in FIG. 8 to FIG. 9. In this case, the polysilicon layer 30 and the substrate 10 can be protected against etching by previous forming an oxide film to the Si surface of the polysilicon layer 30 and the substrate 10 by $O_2$ ashing or the like before the etching.

Figure 18:
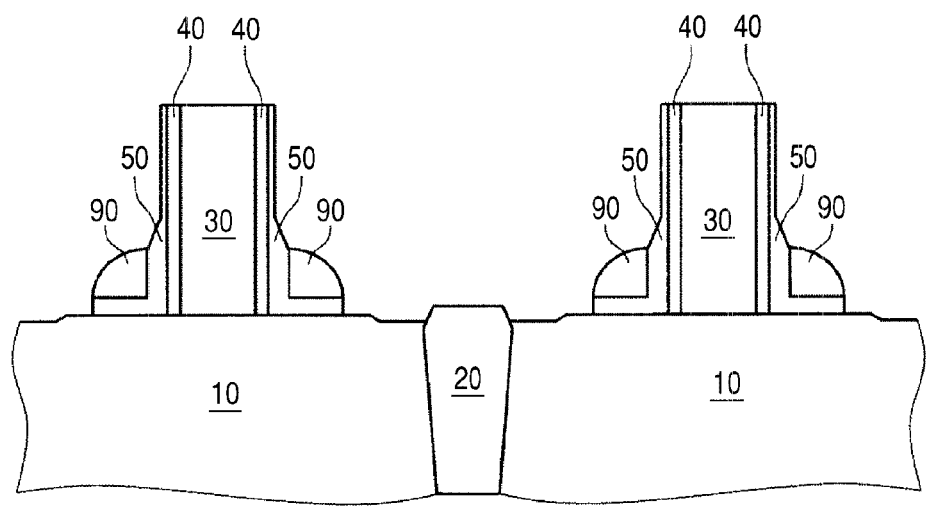
FIG. 18 is a cross sectional view showing a manufacturing method of the semiconductor device according to a first embodiment.

Then, as shown in FIG. 18, the petit side wall is removed by applying etching. In this case, the not bake-hardened petit side wall can be removed at a high rate by applying wet etching using APM (aqueous ammonia hydrogen peroxide).

Figure 19:
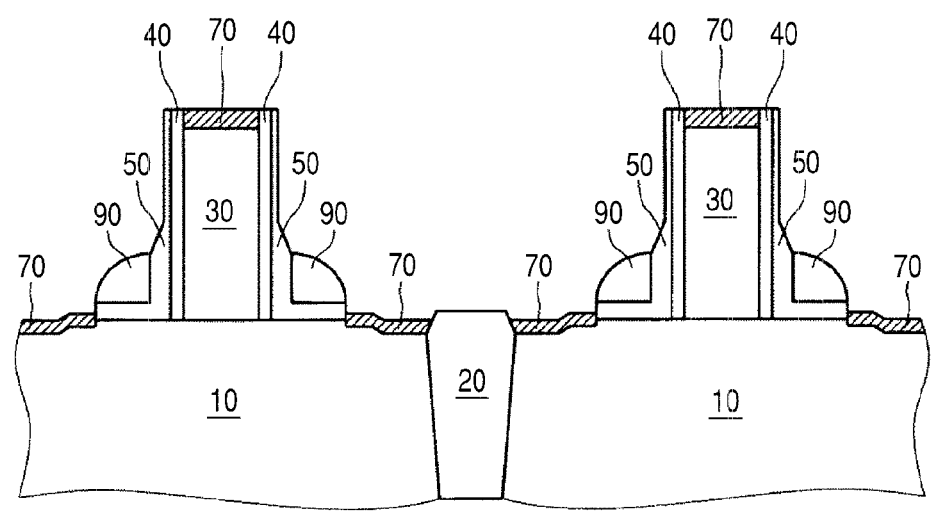
FIG. 19 is a cross sectional view showing a manufacturing method of the semiconductor device according to a first embodiment.

Then, as shown in FIG. 19, a silicide layer 70 comprising NISI is formed over the gate structure and the substrate 10. Specifically, after depositing Ni over the entire surface, it is silicided by annealing and unreacted Ni is removed. Pt may also be used in addition to Ni.

Figure 20:
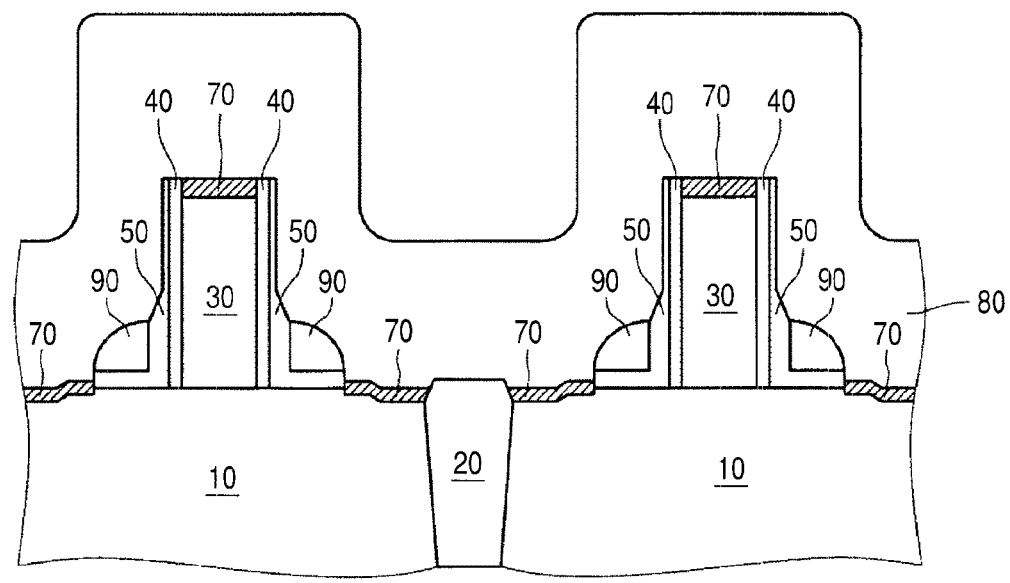
FIG. 20 is a cross sectional view showing a manufacturing method of the semiconductor device according to a first embodiment.

Then, as shown in FIG. 20, a liner nitride film 80 comprising p-SiN is formed by deposition to 50 nm over the entire surface by UV curing at 425° C. so as to cover the gate structure and the side wall, whereby the stress by the liner nitride film 80 can be increased.

As described above, according to the semiconductor devices 500a to 500b of this embodiment, the minimum value of the thickness of the first layer along the lateral side of the gate structure is less than the thickness of the second layer along the upper surface of the substrate 10, in the side wall oxide film having an L-cross sectional shape. Accordingly, the distance between the liner nitride film 80 and the channel region can be decreased and the stress by the liner nitride film 80 can be applied sufficiently to the channel region. Accordingly, the driving performance can be enhanced.

Figure 21:
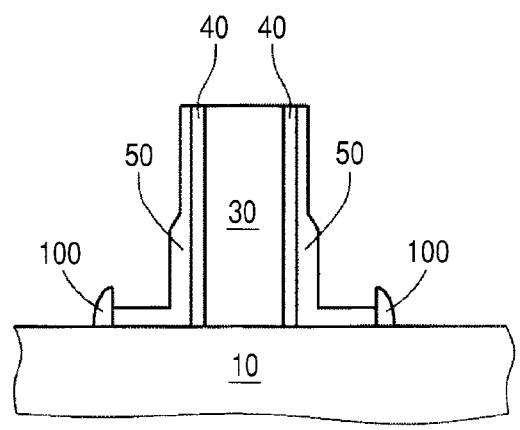
FIG. 21 is a cross sectional view showing another example of a structure of the semiconductor device according to a first embodiment.
Figure 22:
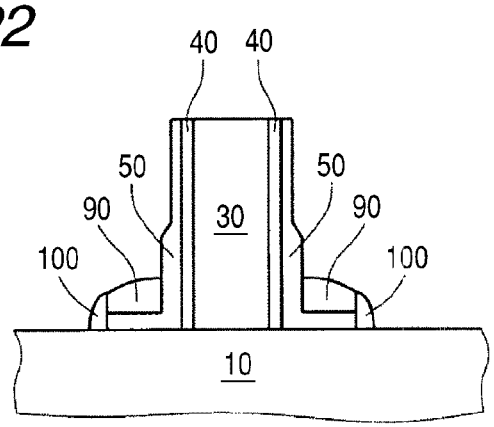
FIG. 22 is a cross sectional view showing another example of a structure of the semiconductor device according to a first embodiment.

While description has been made to the case of removing the petit side wall (oxide film 100), the petit side wall may be left without removal as shown in FIG. 21 to FIG. 22 (FIG. 21 to FIG. 22 correspond respectively to the case of leaving the petit side wall in FIG. 8 to FIG. 9).

Figure 23:
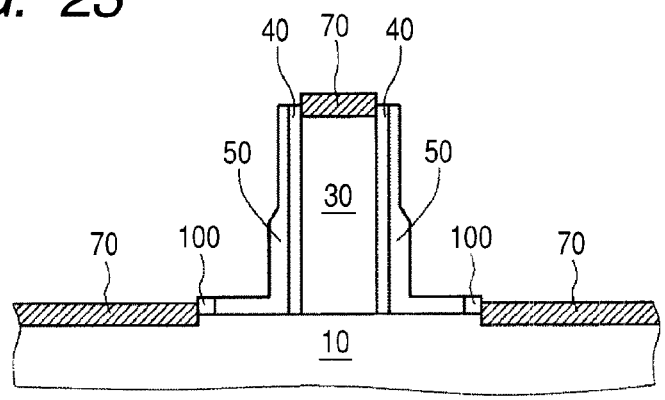
FIG. 23 is a cross sectional view showing another example of a structure of the semiconductor device according to a first embodiment.

Generally, for applying the stress by the liner nitride film 80 sufficiently to the channel region, it is preferred not to leave but remove the petit side wall. However, in a case of not removing but leaving the petit side wall, since the downward engraving of the substrate 10 is decreased in the step of FIG. 16 as described above, the leak current can be decreased. Further as shown in FIG. 23, the width of the silicide layer 70 can be adjusted by adjusting the width of the remaining petit side wall (oxide film 100).

Figure 24:
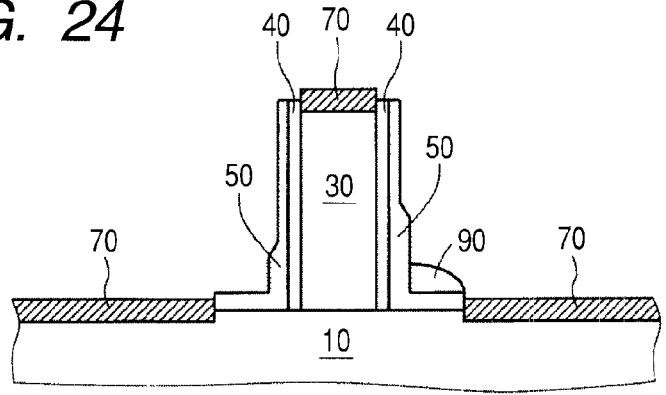
FIG. 24 is a cross sectional view showing another example of a structure of the semiconductor device according to the first embodiment.

Further, while descriptions have been made to a case where the structure has a symmetrical structure on both lateral sides thereof, the structure may be asymmetrical as shown in FIG. 24. In FIG. 24, the shape of the oxide film 50 is different between the right and left of the gate structure, and the nitride film 90 is left only on the right of the gate structure.

Figure 25A:
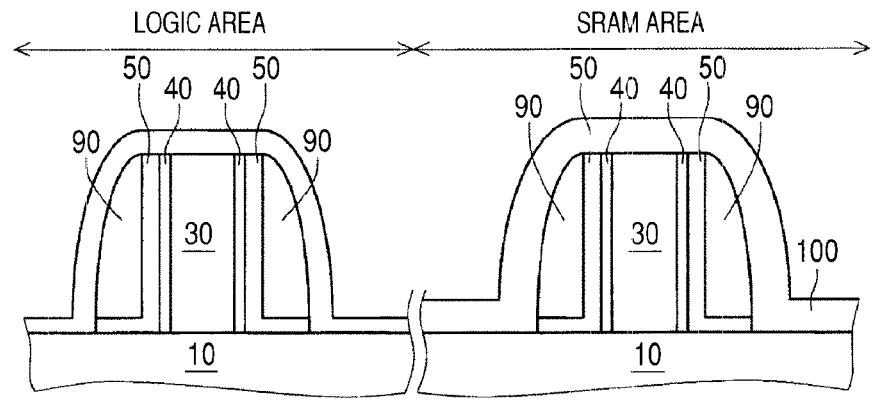
FIG. 25A is a cross sectional view showing another example of the manufacturing method of the semiconductor device according to the first embodiment.
Figure 25B:
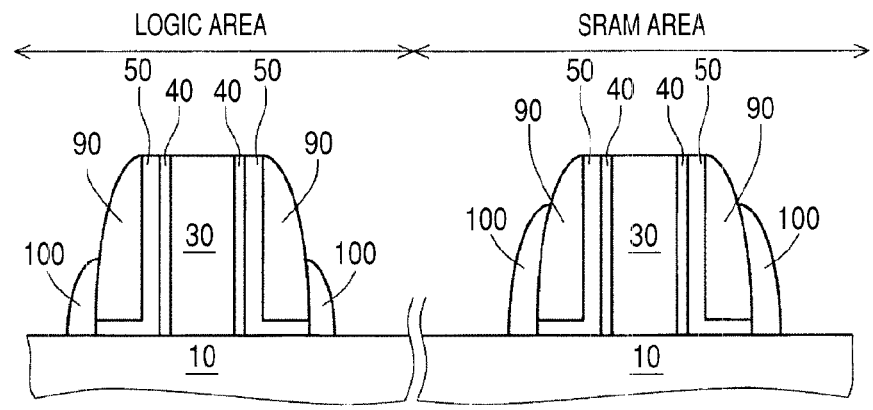
FIG. 25B is a cross sectional view showing another example of the manufacturing method of the semiconductor device according to the first embodiment.
Figure 25C:
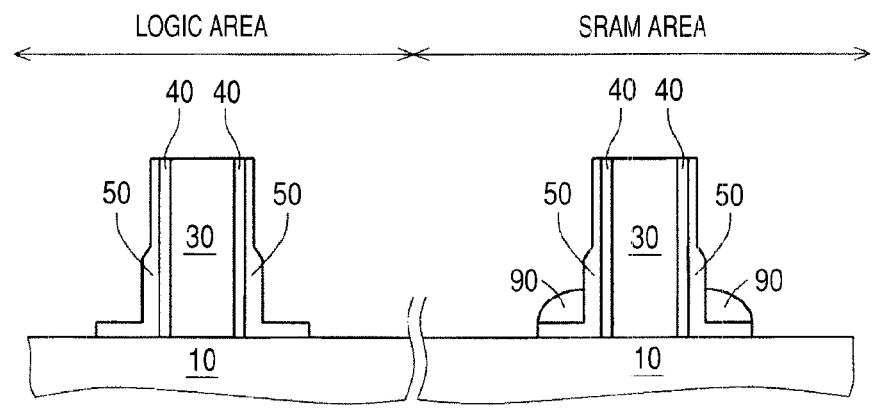
FIG. 25C is a cross sectional view showing another example of the manufacturing method of the semiconductor device according to the first embodiment.

Further, as shown in FIG. 25, while a plurality of functional areas such as a logic area (region for logic) or an SRAM area (region for SRAM) are formed over one identical substrate 10, the structure may be made different in accordance with the functional areas. For example, as shown in FIG. 25A, when the thickness of the oxide film 100 in the logic area is decreased to less than that of the oxide film 100 in the SRAM area by adding a step of selectively wet-etching the oxide film 100 only in the logic area and applying dry etching as shown in FIG. 25B, the nitride film 90 is left only in the SRAM area as shown in FIG. 25C. This can make the characteristics for (Shared Contact) different between the logic area and the SRAM area.

What is claimed is:

1. A semiconductor device including a MISFET, comprising:
    a gate electrode of the MISFET formed over a semiconductor substrate;

a first insulating film formed on the semiconductor substrate and formed on a side surface of the gate electrode;
a second insulating film formed on the semiconductor substrate and formed on the side surface of the gate electrode via the first insulating film; and
a third insulating film formed on the semiconductor substrate via the second insulating film and formed on the side surface of the gate electrode via the first and second insulating films,
wherein a height of the second insulating film is smaller than a height of the first insulating film and is larger than a height of the third insulating film,
wherein a height of the gate electrode is larger than the height of the first insulating film,
wherein the third insulating film is made of a silicon nitride film,
wherein the second insulating film is made of a silicon oxide film, and
wherein the first insulating film is made of a silicon oxide film.

2. A semiconductor device a MISFET, comprising:
a gate electrode of the MISFET formed over a semiconductor substrate;
a first insulating film formed on the semiconductor substrate formed on a side surface of the gate electrode;
a second insulating film formed on the semiconductor substrate and formed on the side surface of the gate electrode via the first insulating film; and
a third insulating film formed on the semiconductor substrate via the second insulating film and formed on the side surface of the gate electrode via the first and second insulating films,
wherein a height of the second insulating film is smaller than a height of the first insulating film and is larger than a height of the third insulating film,
wherein a silicide film is formed on the semiconductor substrate self-aligned with the second and third insulating films,
wherein the third insulating film is made of silicon nitride film,
wherein the second insulating film is made of a silicon oxide film, and
wherein the first insulating film is made of a silicon oxide film.

* * * * *